(12) United States Patent
Srinivasan et al.

(10) Patent No.: US 10,950,450 B2
(45) Date of Patent: *Mar. 16, 2021

(54) SILICIDE FILMS THROUGH SELECTIVE DEPOSITION

(71) Applicant: Applied Materials, Inc., Santa Clara, CA (US)

(72) Inventors: Swaminathan Srinivasan, Pleasanton, CA (US); Abhijit Basu Mallick, Palo Alto, CA (US); Nicolas Breil, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/836,858

(22) Filed: Mar. 31, 2020

(65) Prior Publication Data

US 2020/0227265 A1    Jul. 16, 2020

Related U.S. Application Data

(63) Continuation of application No. 16/220,816, filed on Dec. 14, 2018, now Pat. No. 10,607,841.

(Continued)

(51) Int. Cl.
*H01L 21/285* (2006.01)
*H01L 29/78* (2006.01)
(Continued)

(52) U.S. Cl.
CPC ...... *H01L 21/28562* (2013.01); *C23C 14/042* (2013.01); *C23C 16/042* (2013.01);
(Continued)

(58) Field of Classification Search
CPC ......... H01L 21/28518; H01L 21/28562; H01L 21/28568; H01L 21/28052; H01L 21/76889; H01L 21/285; H01L 21/28512; C23C 14/18; C23C 16/08; C23C 16/14; C23C 16/16; C23C 16/18; C23C 16/42; C23C 14/14–205; C23C 16/06–20;
(Continued)

(56) References Cited

U.S. PATENT DOCUMENTS 4,957,777 A    9/1990   Ilderem et al.
5,320,978 A    6/1994   Hsu
(Continued)

FOREIGN PATENT DOCUMENTS

WO    2014/053202 A1    4/2014

OTHER PUBLICATIONS

PCT International Search Report and Written Opinion in PCT/US2018/065686 dated Apr. 15, 2019, 8 pages.
(Continued)

*Primary Examiner* — Scott B Geyer
(74) *Attorney, Agent, or Firm* — Servilla Whitney LLC

(57) ABSTRACT

Methods for forming silicide films are disclosed. Methods of selectively depositing metal-containing films on silicon surfaces which are further processed to form silicide films are
(Continued)

disclosed. Specific embodiments of the disclosure relate to the formation of silicide films on FinFET structures without the formation of a metal layer on the dielectric.

20 Claims, 2 Drawing Sheets

Related U.S. Application Data

(60) Provisional application No. 62/599,711, filed on Dec. 17, 2017.

(51) Int. Cl.
*H01L 29/66* (2006.01)
*H01L 21/02* (2006.01)
*H01L 21/3105* (2006.01)
*H01L 21/768* (2006.01)
*H01L 21/28* (2006.01)
*C23C 16/04* (2006.01)
*C23C 14/04* (2006.01)

(52) U.S. Cl.
CPC .. *H01L 21/02208* (2013.01); *H01L 21/28052* (2013.01); *H01L 21/28518* (2013.01); *H01L 21/3105* (2013.01); *H01L 21/76864* (2013.01); *H01L 21/76889* (2013.01); *H01L 29/66795* (2013.01); *H01L 29/7851* (2013.01)

(58) Field of Classification Search
CPC .... C23C 14/04–048; C23C 16/04–047; C01B 33/06
See application file for complete search history.

(56) References Cited

U.S. PATENT DOCUMENTS

| | | | |
|---|---|---|---|
| 5,633,036 | A | 5/1997 | Seebauer et al. |
| 5,876,796 | A | 3/1999 | Regolini et al. |
| 6,019,839 | A | 2/2000 | Acgutharaman et al. |
| 6,518,168 | B1 | 2/2003 | Clem et al. |
| 9,076,647 | B2 | 7/2015 | Chung et al. |
| 9,768,013 | B2 | 9/2017 | Dube et al. |
| 10,607,841 | B2 * | 3/2020 | Srinivasan ........ H01L 29/66795 |
| 2004/0209432 | A1 | 10/2004 | Ku et al. |
| 2006/0014393 | A1 | 1/2006 | Lu et al. |
| 2007/0098902 | A1 | 5/2007 | Engstrom et al. |
| 2008/0032064 | A1 | 2/2008 | Gordon et al. |
| 2008/0286921 | A1 | 11/2008 | Yu et al. |
| 2015/0132898 | A1 | 5/2015 | Cheng et al. |
| 2016/0005649 | A1 * | 1/2016 | Haukka ................... C23C 16/04 |
| | | | 438/653 |
| 2016/0148839 | A1 * | 5/2016 | Abelson ................. C23C 16/18 |
| | | | 438/608 |
| 2016/0222504 | A1 | 8/2016 | Haukka et al. |
| 2017/0084449 | A1 | 3/2017 | Dube et al. |
| 2017/0342553 | A1 | 11/2017 | Yu et al. |

OTHER PUBLICATIONS

Katz, A., et al., "Properties of titanium nitride thin films deposited by rapid-thermal-lowpressure-metalorganic-chemical-vapor-deposition technique using tetrakis (dimethylamido) titanium precursor", Journal of Applied Physics 70, 3666 (1991), 13 pages.

* cited by examiner

SILICIDE FILMS THROUGH SELECTIVE DEPOSITION

CROSS-REFERENCE TO RELATED APPLICATIONS

This application is a continuation of U.S. application Ser. No. 16/220,816, filed Dec. 14, 2018 which claims priority to U.S. Provisional Application No. 62/599,711, filed Dec. 17, 2017, the entire disclosures of which are hereby incorporated by reference herein.

FIELD

Embodiments of the disclosure relate to methods for forming silicide films. More particularly, embodiments of the disclosure are directed to methods of selectively depositing films on silicon surfaces which are further processed to form silicide films.

BACKGROUND

A Fin Field Effect Transistor, also known as a FinFET, is a type of non-planar or three dimensional transistor used in the design of modern processors. As in earlier, planar designs, it is typically built on an SOI (silicon on insulator) substrate. However, FinFET designs also use a conducting channel that rises above the level of the insulator, creating a thin silicon-based structure, shaped like a fin, which is called a gate electrode. This fin-shaped electrode allows multiple gates to operate on a single transistor. FinFET devices also have significantly faster switching times and higher current density than the mainstream CMOS technology.

There is an ongoing need for new FinFET designs. Specifically, there is a need for new materials and surface compositions to allow for an expanding set of design options. Selective deposition has shown promise as it has the potential to allow for the deposition of films on select surfaces and simplify integration schemes.

Selective deposition of materials can be accomplished in a variety of ways. For instance, some process may have inherent selectivity to surfaces just based on their surface chemistry. These processes are fairly rare and usually need to have surfaces with drastically different surface energies, such as metals and dielectrics. In FinFETs, and other cases where surfaces are similar (e.g. $SiO_2$ versus SiN), the surfaces need to be selectively blocked by employing surface treatments that selectively react with one surface and not the other, effectively blocking any surface reactions during a subsequent deposition process. Yet, some deposition precursors are not effectively blocked by current technologies.

Therefore, there is an ongoing need in the art for methods and materials to inhibit deposition on certain surfaces while selectively depositing films on other surfaces.

SUMMARY

One or more embodiments of the disclosure are directed to a substrate processing method that comprises providing a substrate comprising a first semiconductor surface and a second dielectric surface. The substrate is exposed to a blocking compound to selectively form a blocking layer on the second surface over the first surface. The substrate is exposed to a titanium precursor to selectively deposit a Ti-containing layer on the first surface over the second surface. The substrate is heated to form a modified first surface comprising titanium and silicon.

Additional embodiments of the disclosure are directed to a substrate processing method that comprises providing a substrate comprising a first semiconductor surface and a second dielectric surface. The substrate is exposed to a blocking compound to selectively form a blocking layer on the second surface. The substrate is exposed to a titanium precursor to selectively deposit a Ti-containing layer on the first surface over the second surface. The substrate is exposed to a germanium precursor to selectively deposit a Ge-containing layer on the first surface over the second surface. The substrate is heated to form a modified first surface comprising titanium, germanium and silicon.

Further embodiments of the disclosure are directed to a substrate processing method that comprises providing a substrate comprising a first silicon surface and a second silicon oxide surface. The substrate is exposed to a blocking compound to selectively form a blocking layer on the second surface. The substrate is exposed to a titanium precursor to selectively deposit a Ti-containing layer on the first surface over the second surface. The substrate is exposed to a silicon precursor to selectively deposit a Si-containing layer on the first surface over the second surface. The substrate is heated to form a modified first surface consisting essentially of $TiSi2$.

BRIEF DESCRIPTION OF THE DRAWING

So that the manner in which the above recited features of the disclosure can be understood in detail, a more particular description of the disclosure, briefly summarized above, may be had by reference to embodiments, some of which are illustrated in the appended drawing. It is to be noted, however, that the appended drawing illustrates only typical embodiments of the disclosure and is therefore not to be considered limiting of its scope, for the disclosure may admit to other equally effective embodiments.

Figure 1:
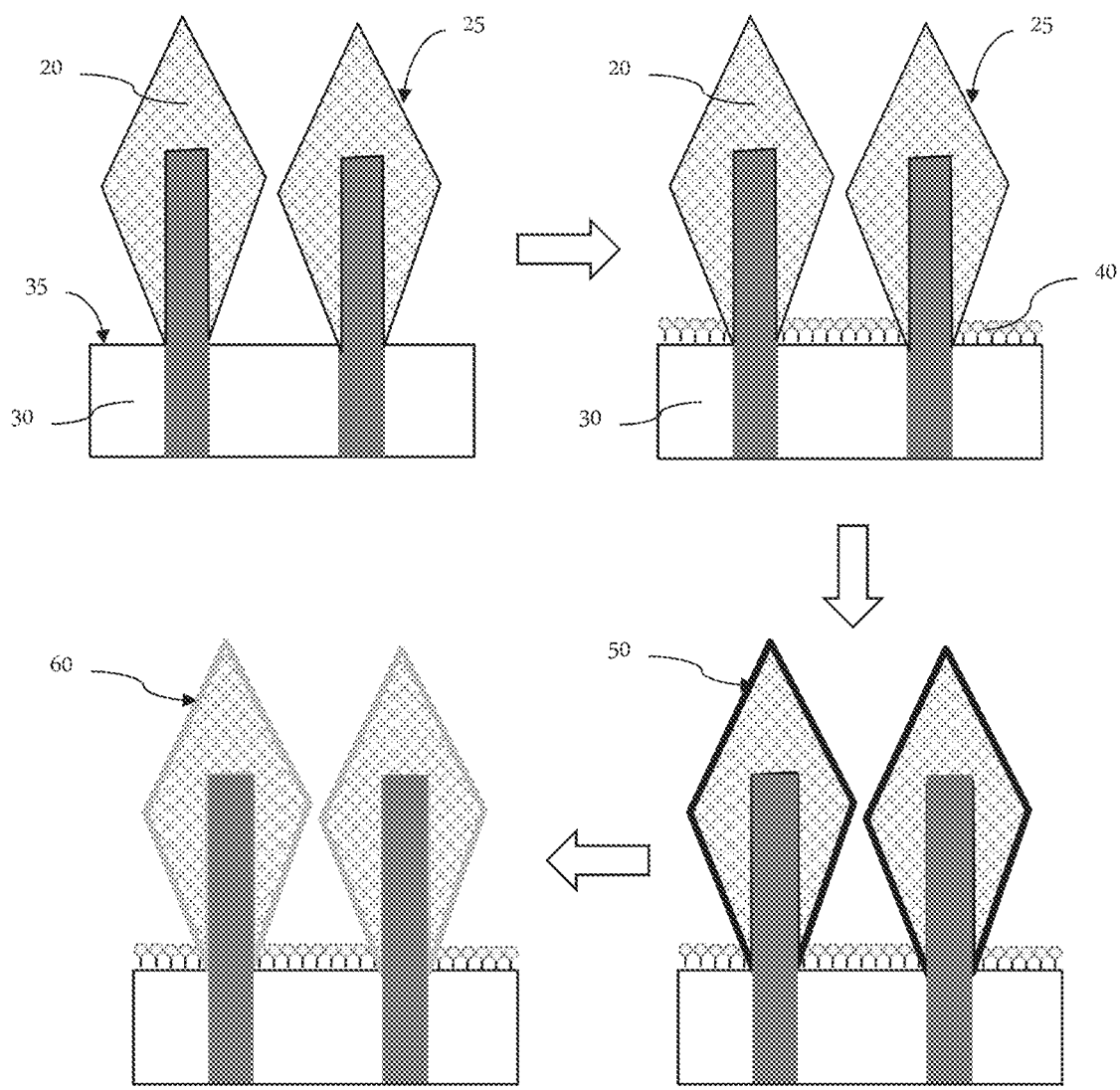
FIG. 1 illustrates a selective deposition process in accordance with one or more embodiment of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Embodiments of the disclosure provide methods for processing substrates that result in the formation of TiSi films on semiconductor surfaces but not dielectric surfaces. The process of various embodiments uses selective deposition to form films on portions of the substrate which are further processed.

A "substrate surface", as used herein, refers to any portion of a substrate or portion of a material surface formed on a substrate upon which film processing is performed. For example, a substrate surface on which processing can be performed include materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. Substrates may have various dimensions, such as 200 mm or 300 mm diameter wafers, as well as, rectangular or square panes. In some embodiments, the substrate comprises a rigid discrete material.

"Atomic layer deposition" as used herein refers to the sequential exposure to a substrate of two or more deposition gases to deposit a layer of material on a substrate surface. As used in this specification and the appended claims, the terms "reactive compound", "reactive gas", "reactive species", "precursor", "process gas", :deposition gas" and the like are used interchangeably to mean a substance with a species capable of reacting with the substrate surface or material on the substrate surface in a chemical reaction (e.g., substitution, elimination, addition, oxidation, reduction). The substrate, or portion of the substrate, is exposed sequentially to the two or more reactive compounds which are introduced into a reaction zone of a processing chamber. In a time-domain process, exposure to each reactive compound is separated by a time delay to allow each compound to react with the substrate surface and then be purged from the processing chamber. In a spatial process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired molecular layer or layer thickness is formed on the substrate surface. In either scenario, the process of pulsing compound A, purge gas, compound B and purge gas is a cycle. A cycle can start with either compound A or compound B and continue the respective order of the cycle until achieving a film with the predetermined thickness.

In an embodiment of a spatial process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas, although not simultaneously.

One or more embodiments of the disclosure advantageously provide methods of processing a substrate which include selectively depositing a film on a semiconductor surface (e.g. silicon) with substantially no deposition on a dielectric surface (e.g. silicon oxide). In some embodiments, the selective deposition is advantageously accomplished by combining a selective surface blocking step utilizing a blocking compound that selectively reacts with a dielectric surface to form a blocked surface. Deposition proceeds on other substrate surfaces which remain unblocked.

A general surface mechanism of one or more embodiment of the disclosure can be carried out to block dielectric surfaces and subsequently stop or minimize deposition of films thereon while depositing these films on semiconductor surfaces. Without being bound by any particular theory of operation, it is believed that the blocking compounds described herein, when used with the precursors described herein prevent the reaction of the precursors with the dielectric surface.

In some embodiments, the dielectric surface groups can be reacted with blocking molecules that have reactivity with —OH terminations and not —H terminations. These molecules can be introduced to the substrates via vapor phase delivery, in solution form or in neat form. After selective surface blocking, ALD or CVD processes can be employed to grow films selectively on the semiconductor surface.

Figure 2:
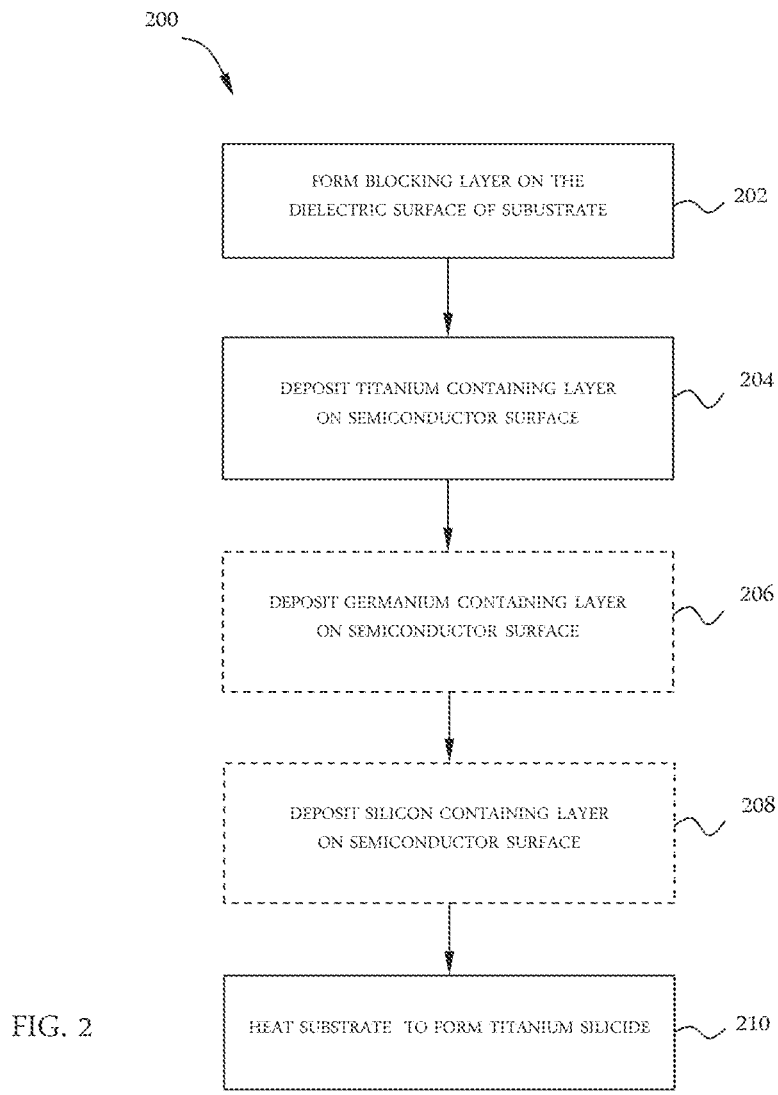
FIG. 2 illustrates an exemplary process sequence for the selective deposition of a titanium containing layer on semiconductor surface according to one or more embodiment of the disclosure.

With reference to FIG. 1 and FIG. 2, one or more embodiments of the disclosure are directed to a method 200 of substrate processing. The method comprises providing a substrate comprising a first material 20 and a second material 30. As used in this manner, the term "providing a substrate" means that the substrate is placed into a position (e.g., within a processing chamber) for processing. In some embodiments, the first material 20 comprises a semiconductor and the first material 20 has a semiconductor surface 25. In some embodiments, the second material 30 comprises a dielectric and the second material 30 has a dielectric surface 35. In this regard, the semiconductor surface 25 may be referred to as a first semiconductor surface. Similarly, the dielectric surface 35 may be referred to as a second dielectric surface. It is not to be understood that the disclosure requires multiple dielectric surfaces.

The first material 20 may be any suitable semiconductor material. In some embodiments, the first material 20 consists essentially of silicon. As used in this specification and the appended claims, a material that "consists essentially of" a stated composition means that greater than or equal to about 95%, 98% or 99% of the material is the stated composition.

The second material 30 may be any suitable dielectric material. In some embodiments, the second material 30 comprises silicon oxide. In some embodiments, the second material 30 consists essentially of $SiO_2$. As used in this regard, silicon oxide is any suitable material comprising silicon and oxygen. In some embodiments, the second surface 35 consists essentially of silicon and oxygen. In some embodiments, the material of the second surface 35 is a stoichiometric silicon oxide. In some embodiments, the ratio of silicon to oxygen in the second surface 35 is about 1:2. In some embodiments, the ratio of silicon to oxygen atoms is a non-stoichiometric ratio. In some embodiments, the ratio of silicon to oxygen in the second surface 35 is less than 1:2. In some embodiments, the ratio of silicon to oxygen in the second surface 35 is greater than 1:2.

FIG. 1 illustrates a schematic, cross-sectional view of a substrate 10 having three dimensional (3D) structures formed thereon according to one or more embodiment described herein. In some embodiments, the substrate 10 includes the 3D structures which extend from a base material layer. In some embodiments, the base material layer may be a dielectric material, such as oxides, nitrides, or the like. For example, the substrate 10 may be a silicon-on-insulator substrate. The embodiments described herein are generally made with reference to a 300 mm circular substrate, however, it is contemplated that various other substrate dimensions may benefit from the embodiments described herein.

The 3D structures of the substrate may be formed on the base material layer by various patterning and etching processes. In some embodiments, the 3D structures may be formed with dimensions suitable for implementation as fin field-effect transistors (FinFETs) in complimentary metal-oxide semiconductor (CMOS) transistors, however, other transistor types, substrate features and substrate surfaces without features may also benefit from the embodiments described herein. In some embodiments, the 3D structures may be suitable for and may have dimensions commensurate for utilization in current technology nodes and advanced technology nodes, such as a sub-10 nm node.

The 3D structures may be the same material as the base material layer or a material different from the base material layer (as illustrated in FIG. 1). In some embodiments, the 3D structures may be formed from silicon. In some embodiments, the 3D structures extend from the base material layer and are spaced apart by trenches.

At 202, the substrate 10, including the first surface 25 and second surface 35, is exposed to a blocking compound. The blocking compound can be any suitable compound that can react with the second surface 35 and not the first surface 25. The blocking compound reacts with the second surface 35 to form a blocking layer 40 on the second surface 35.

In some embodiments, the blocking compound comprises a compound of the general formula R₃Si—X, where each R is independently C1-C4 alkyl and X is a leaving group. As used in this regard, C1-C4 alkyl means saturated carbon chains with 1-4 carbon atoms. In some embodiments, these carbon chains are linear. In some embodiments, these carbon chains are branched. In some embodiments, each R is methyl. In some embodiments, X is selected from halide, azide, amino, hydrazide, cyanide or isocyanate groups.

In some embodiments, X comprises a primary, secondary or tertiary amine with linear C1-6 alkyl or branched C1-4 alkyl groups. In some embodiments, X is a cyclic amine with an up to 6-membered ring. In some embodiments, X comprises a cyclic pyrrolyl group (—N(CH₂)₄). In some embodiments, X comprises a cyclic pyrrolidine group (—N(CH₂)₄). In some embodiments, the blocking compound comprises trimethylsilylpyrrolidine (CH₃)₃SiN(CH₂)₄. In some embodiments, the blocking compound consists essentially of trimethylsilylpyrrolidine. Trimethylsilylpyrrolidine is a compound of Formula I:

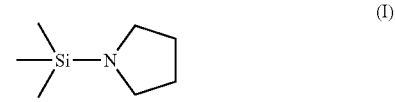

As used in this manner, the term "consists essentially of" means that the reactive component of the blocking compound (not including inert, diluent or carrier species) is greater than or equal to about 95%, 98% or 99% of the stated species, on a molar basis.

The blocking layer may be formed at any suitable temperature. In some embodiments, the substrate is maintained at a temperature in the range of about 200° C. to about 500° C., in the range of about 250° C. to about 450° C., in the range of about 250° C. to about 400° C., or in the range of about 300° C. to about 450° C. In some embodiments, the substrate is maintained at a temperature less than or equal to about 450° C., less than or equal to about 400° C., less than or equal to about 375° C., less than or equal to about 350° C., less than or equal to about 300° C., or less than or equal to about 250° C. In some embodiments, the substrate is maintained at a temperature greater than or equal to about 200° C., greater than or equal to about 225° C., greater than or equal to about 250° C., greater than or equal to about 300° C., or greater than or equal to about 350° C.

At 204, after formation of the blocking layer 40, a selective deposition of a metal layer 50 on the first surface 25 can be performed. The metal layer 50 can be deposited by any suitable deposition technique known to the skilled artisan. Suitable techniques include, but are not limited to, chemical vapor deposition, atomic layer deposition or physical vapor deposition. In some embodiments, the metal layer 50 comprises titanium and the metal layer 50 is deposited by atomic layer deposition.

The description below discloses a general process for depositing a metal layer on the substrate 10. In some embodiments, the metal is titanium and the metal layer is a titanium-containing layer 50. In some embodiments, the metal layer further comprises an additional metal alloyed with titanium.

In some embodiments, germanium is alloyed with titanium. In some embodiments, germanium is deposited separately from titanium to create a bi-layer film.

The substrate 10, including the first surface 25 and the blocking layer 40, is exposed to a metal precursor. In some embodiments, the metal precursor chemisorbs onto the first surface 25 to deposit a layer of metal species on the first surface 25. In these embodiments, the layer of metal species on the first surface 25 reacts with a reagent to form a metal film. In some embodiments, the metal precursor and the reagent are exposed to the substrate 10 at the same time and react to form a metal film on the first surface 25. In some embodiments, the metal precursor and the reagent are each exposed to the substrate 10 separately. In some embodiments, the metal precursor and the reagent are exposed to the substrate 10 simultaneously. Some embodiments deposit the metal film 50 through a time-domain ALD process. Some embodiments deposit the metal film 50 through a spatial ALD process.

The metal film is a general term used to describe metal-containing materials. In some embodiments, the metal film is a pure metal film. As used in this regard, "a pure metal film" means that metal atoms are greater than or equal to about 98%, 99% or 99.5% of the metal film, on an atomic basis excluding hydrogen. In some embodiments, the metal film comprises other atoms. In some embodiments, the metal film comprises one or more of oxygen, nitrogen, carbon, silicon, boron or germanium.

The metal precursor can be any suitable compound that can react with the reagent to form a metal film 50. In some embodiments, the metal precursor comprises at least one amine ligand. In some embodiments, the metal precursor comprises a compound of the formula $M(NR'_2)_a$ where each R' is independently H, C1-C4 alkyl or trimethylsilyl and a is greater than or equal to one. As used in this regard C1-C4 alkyl means saturated carbon chains with 1-4 carbon atoms. In some embodiments, these carbon chains are linear. In some embodiments, these carbon chains are branched.

In some embodiments, R' consists essentially of ethyl groups. In some embodiments, R' consists essentially of methyl groups. In some embodiments, the R' groups within a single ligand are identical (e.g. $N(CH_3)_2$). In some embodiments, the R' groups within a single ligand are different (e.g. $N(CH_3)(C_2H_5)$). In some embodiments, the metal precursor consists essentially of tetrakis(ethylmethylamido)titanium. As used in this manner, the term "consists essentially of" means that the reactive component of the metal precursor (not including inert, diluent or carrier species) is greater than or equal to about 95%, 98% or 99% of the stated species, on a molar basis.

In some embodiments, the metal precursor comprises at least one halide ligand. In some embodiments, the metal precursor does not contain any metal halides. In some embodiments, the film comprises titanium and the metal precursor does not contain any $TiCl_4$.

In some embodiments, the metal precursor comprises at least one oxo ligand. In some embodiments, the oxo ligand is of the general formula —OR*, where R* is a C1-C8 alkyl group. In some embodiments, the at least one oxo ligand is selected from the group consisting of methoxy, ethoxy, propoxy, isopropoxy, butoxy, t-butoxy, and ethylhexyloxy.

The metal of the metal precursor can be any suitable metal. In some embodiments, the metal of the metal precursor is selected from Ti, Zr, Hf, or Ta. In some embodiments, the metal precursor consists essentially of compounds which contain Ti. In this regard, the metal precursor may be referred to as a titanium precursor. In some embodiments, the metal precursor consists essentially of compounds which contain Zr. In some embodiments, the metal precursor consists essentially of compounds which contain Hf. In some embodiments, the metal precursor consists essentially of compounds which contain Ta.

The reagent can be any suitable compound that can react with the metal precursor to form a metal film 50. In some embodiments, the reagent is exposed to the substrate separate from the metal precursor. Suitable reagents may include, but are not limited to, hydrogen, ammonia, hydrazine, hydrazine derivatives, silanes, halosilanes, polysilanes, boranes, haloboranes and other co-reagents to make metal, metal nitride, metal silicide, and/or metal boride films. Suitable reagents may also include, but are not limited to, oxygen, ozone, water and other oxygen based reagents to make metal or metal oxide films. In some embodiments, plasmas of a reagent are used to form the metal film 50. In some embodiments, the plasma of the reagent is generated remotely. In some embodiments, the reagent comprises one or more of hydrogen, ammonia or water.

In some embodiments, the reagent consists essentially of hydrogen and the metal film is a pure metal film. In some embodiments, the reagent consists essentially of ammonia and the metal film is a metal nitride film. In some embodiments, the reagent consists essentially of water and the metal film is a metal oxide film. As used in this manner, the term "consists essentially of" means that the reagent (not including inert, diluent or carrier species) is greater than or equal to about 95%, 98% or 99% of the stated component, on a molar basis. As used in this regard, a pure metal film is any film consisting essentially of metal atoms. As used in this regard, a metal nitride film is any film comprising metal and nitrogen atoms. As used in this regard, a metal oxide film is any film comprising metal and oxygen atoms. Films which comprise atoms other than metal (e.g. metal nitrides or metal oxides) may or may not be comprised of atoms in a stoichiometric ratio.

At 206, a germanium-containing layer is deposited on the first surface.

Deposition of the germanium-containing layer is an optional process. In some embodiments, a titanium-containing layer is deposited on the first surface and a germanium-containing layer is also deposited on the first surface. In some embodiments, the titanium-containing layer is deposited first. In some embodiments, the germanium-containing layer is deposited first.

The germanium-containing layer may be deposited by any suitable process. In some embodiments, the germanium-containing layer is deposited by a process analogous to the process described above for the metal layer where germanium is the metal.

At 208, a silicon-containing layer is deposited on the first surface. Deposition of the silicon-containing layer is an optional process. In some embodiments, a titanium-containing layer is deposited on the first surface and a silicon-containing layer is also deposited on the first surface. In some embodiments, the titanium-containing layer is deposited first. In some embodiments, the silicon-containing layer is deposited first.

The silicon-containing layer may be deposited by any suitable process. In some embodiments, the silicon-containing layer is deposited by a process analogous to the process described above for the metal layer where silicon is the metal. In some embodiments, a silicon-containing layer is deposited by exposing the substrate to a silicon precursor. In some embodiments, the substrate is also exposed to a reactant. In some embodiments, the silicon-containing layer is deposited on both the first surface and the blocking layer. In some embodiments, the silicon-containing layer may be deposited by PVD and/or CVD. In some embodiments, the silicon-containing layer is amorphous. In some embodiments, the silicon-containing layer is polycrystalline. In some embodiments, the silicon-containing layer is deposited epitaxially.

At 210, after formation of the metal film 50, the substrate is heated to form a modified first surface 60. Without being bound by theory. It is believed that heating the substrate causes the metal layer to incorporate into the surface of semiconductor material (i.e. the first surface 25). In some embodiments, the modified first surface 60 comprises a silicide. In some embodiments, the modified first surface 60 comprises titanium and silicon. In some embodiments, the modified first surface 60 consists essentially of $TiSi_2$.

In some embodiments, process 210 comprises an anneal process. In some embodiments, the modified first surface 60 comprises TiSi-C49. In some embodiments, forming the modified first surface 60 comprises annealing the substrate at a temperature in a range of about 500° C. to about 700° C. to form TiSi-C49. In some embodiments, the anneal process is performed for greater than about 1 minute. In some embodiments, forming the modified first surface 60 comprises laser annealing the substrate to a temperature in a range of about 800° C. to about 1000° C. to form TiSi-C49. In some embodiments, the laser anneal process is a millisecond laser anneal.

In some embodiments, the modified first surface 60 comprises TiSi-C54. In some embodiments, forming the modified first surface 60 comprises annealing the substrate at a temperature in a range of about 700° C. to about 900° C. to form TiSi-C54. In some embodiments, the anneal process is performed for greater than about 1 minute. In some embodiments, forming the modified first surface 60 comprises laser annealing the substrate to a temperature in a range of about 1000° C. to about 1200° C. to form TiSi-C54. In some embodiments, the laser anneal process is a millisecond laser anneal.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A selective deposition method comprising:
 exposing a substrate to a blocking compound to selectively form a blocking layer on a second dielectric surface, the substrate comprising a first semiconductor surface and the second dielectric surface;
 exposing the substrate to a titanium precursor to selectively deposit a Ti-containing layer on the first surface over the second surface;
 exposing the substrate to a silicon precursor to selectively deposit a Si-containing layer on the first surface over the second surface; and
 annealing the substrate to form a modified first surface comprising titanium and silicon.

2. The method of claim 1, wherein the Si-containing layer is amorphous.

3. The method of claim 1, wherein the modified first surface comprises TiSi-C49.

4. The method of claim 1, wherein the modified first surface comprises TiSi-C54.

5. A selective deposition method comprising:
 exposing a substrate with a substrate surface comprising a first semiconductor surface and a second dielectric surface to a blocking compound to selectively form a blocking layer on the second surface over the first surface;
 exposing the substrate surface to a titanium precursor to selectively deposit a Ti-containing film on the first surface over the second surface; and
 annealing the substrate to form a modified first surface comprising titanium and silicon.

6. The method of claim 5, wherein the substrate is annealed at a temperature in a range of about 500° C. to about 900° C. for a period of greater than about 1 minute.

7. The method of claim 5, wherein the substrate is annealed by a millisecond laser anneal at a temperature in a range of about 800° C. to about 1200° C.

8. A selective deposition method comprising:
 exposing a substrate with a substrate surface comprising a first semiconductor surface and a second dielectric surface to a blocking compound to selectively form a blocking layer on the second surface over the first surface;
 exposing the substrate surface to a metal precursor to selectively deposit a metal film on the first surface over the second surface, the metal precursor comprising one or more of Ti, Zr, Hf or Ta; and
 heating the substrate to form a modified first surface comprising metal and silicon.

9. The method of claim 8, wherein the blocking compound comprises a blocking agent of a general formula $R_3Si$—X, where each R is independently C1-C4 alkyl and X is any leaving group.

10. The method of claim 9, wherein X is a leaving group selected from halide, azide, amino, hydrazide, cyanide or isocyanate.

11. The method of claim 8, wherein the substrate is exposed to the blocking compound at a temperature in a range of about 200° C. to about 500° C.

12. The method of claim 8, wherein the metal precursor comprises a species comprising at least one halide ligand.

13. The method of claim 8, wherein the metal precursor does not contain any metal halides.

14. The method of claim 8, wherein the metal precursor comprises a species comprising at least one oxo ligand of a general formula —OR*, where R* is a C1-C8 alkyl group.

15. The method of claim 14, wherein the at least one oxo ligand is selected from the group consisting of methoxy, ethoxy, propoxy, isopropoxy, butoxy, t-butoxy, and ethylhexyloxy.

16. The method of claim 8, wherein exposing the substrate to a metal precursor further comprises exposing the substrate to a reagent comprising one or more of hydrogen, ammonia, or water.

17. The method of claim 16, wherein the reagent consists essentially of hydrogen and the metal film is a pure metal film.

18. The method of claim 16, wherein the reagent consists essentially of ammonia and the metal film is a metal nitride film.

19. The method of claim 16, wherein the reagent consists essentially of water and the metal film is a metal oxide film.

20. The method of claim 8, wherein the modified first surface comprises a silicide.

* * * * *